United States Patent [19]
Malmborg

[11] B 3,995,243
[45] Nov. 30, 1976

[54] FAULT DETECTION INDICATOR

[75] Inventor: Floyd Leonard Malmborg, Brookfield Center, Conn.

[73] Assignee: North American Philips Corporation, New York, N.Y.

[22] Filed: Oct. 17, 1974

[21] Appl. No.: 515,452

[44] Published under the second Trial Voluntary Protest Program on February 10, 1976 as document No. B 515,452.

[52] U.S. Cl. .................. 335/253; 335/81; 335/179; 335/229
[51] Int. Cl.² ........................................... H01F 7/08
[58] Field of Search .......... 337/179, 178, 177, 180, 337/182, 183, 78, 79, 80, 81, 229, 230, 233, 234, 253, 254

[56] References Cited
UNITED STATES PATENTS

| | | | |
|---|---|---|---|
| 2,919,324 | 12/1959 | Schuessler | 335/182 |
| 3,132,290 | 5/1964 | Kumpf | 335/254 |
| 3,543,202 | 11/1970 | Naybor | 335/229 |
| 3,683,239 | 8/1972 | Sturman | 335/179 |
| 3,755,766 | 8/1973 | Read, Jr. | 335/229 |
| 3,783,423 | 1/1974 | Mater et al. | 335/229 |

*Primary Examiner*—Harold Broome
*Attorney, Agent, or Firm*—Frank R. Trifari

[57] ABSTRACT

A fault detection indicator comprises an electromagnetic core and coil assembly, a repulsion permanent magnet and two trip-latch permanent magnets. In addition, an indicator button may be employed to present the state of the indicator. The indicator design presents a simple construction which will electrically change its indicated state, remain in latched position and be capable of being manually restored. Internal switches may be included in the indicator which function in conjunction with the trip-latch magnets.

12 Claims, 10 Drawing Figures

FAULT DETECTION INDICATOR

FIELD OF THE PRESENT INVENTION

The present invention relates to fault indicator devices and, more particularly, to latching indicators which rely on permanent magnets to provide the appropriate latching function.

DESCRIPTION OF THE PRIOR ART

A variety of devices are known in the art which accomplish the function of providing a fault indicator which indicates change in condition, which indicator can be latched in its activated state and subsequently manually restored. Some of these devices include springs for biasing the indicator in its normal position and reasonably complicated trip-latch mechanisms for providing the necessary latching arrangement (i.e. the indicator will remain in its "fault" condition until the fault is removed). It is the purpose of the present invention to provide a particularly simple, inexpensive commercial fault indicator which does not rely on mechanical spring tension or biasing and does not employ complex latching techniques.

BRIEF SUMMARY OF THE INVENTION

It is accordingly an object of the present invention to provide a fault indicator device which includes no spring biasing means.

It is another object of the present invention to provide a fault indicator device employing a coil and core, a movable permanent magnet onto which an indicator is affixed, and which includes at least one latching magnet for providing the latching function.

It is another object of the present invention to provide a fault-detection indicator which includes at least one switch contact which is activated by the latching means.

It is also an object of the present invention to provide a fault indicator which cannot provide a false indication of a "no fault" condition after it is reset.

It is a further object of the present invention to provide a fault indicator which can be manually reset.

In accordance with the present invention, a fault indication device adapted to being excited by an electrical voltage for indicating a fault condition comprises a housing and an indication element including a permanent magnet having first and second end portions of opposite magnetic polarity, the indication element being free to move in a first predetermined direction within the housing. Also included is a ferromagnetic core and coil assembly, the coil being a conductive wire wound about the inner core, the coil having input terminals for application of an electrical voltage, the permanent magnet indicating element having its first end portion being disposed on the end surface of the core when the coil is not excited by an electrical voltage. At least one latching permanent magnet is also included, the magnet having first and second end portions of opposite magnetic polarity and being free to move within the housing in a direction at right angles to the first predetermined direction, the magnet being oriented so that during the unexcited condition of the coil, the latching magnet is repelled by the second end portion of the indicating element permanent magnet, the input terminals being adapted to receiving an excitation voltage which causes a magnetic polarity to appear on the core and which is repelling to the first end portion of the indicating magnet thereby forcing said indicating element to move in the first predetermined direction whereby the second end portion of the indicating magnet is juxtaposed proximate to the latching magnet thereby attracting said latching magnet to said indicating magnet.

Other and further objects of the present invention will be made clear by the following detailed description and drawings while the scope of the invention will be pointed out in the appended claims.

DESCRIPTION OF THE PREFERRED EMBODIMENTS

Figure 1:
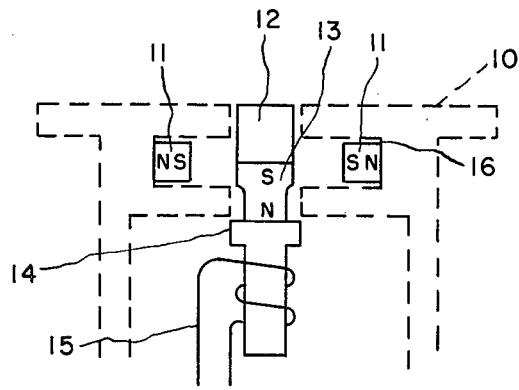
FIG. 1 illustrates a partial schematic cross-section of the fault detection device of the present invention in the no-fault condition of operation.

Referring initially to FIG. 1, shown there are the principal elements of the fault indicator of the present invention. A housing 10 contains core 14 and coil-assembly 15 which is rigidly fixed to the housing and is coupled to the various permanent magnet elements. One of the elements is the indicator magnet 13 upon which is affixed the indicator itself 12. The combined element containing portions 12 and 13 is free to move axially within the housing 10.

The primary latching elements are indicated as 11 which are shown in FIG. 1 to comprise two permanent magnets which are free to move radially within slots 16 of the housing 10. The core of the core and coil assembly 14, 15 is constructed of ferromagnetically soft iron. Permanent indicator magnet 13 has one of its poles flush with the surface of core 14, the permanent magnet being retained in this position by virtue of the magnetic force of magnet 13. In the FIG. 1 embodiment, the coil is unexcited which corresponds to a no-fault condition of the indicator in this embodiment. The indicator may also be designed so that presence of the excitation signal indicates no-fault.

In the preferred arrangement of the device, it is important that the relative relationship of the poles of the latch magnets 11 and the indictor 13 to be arranged as shown (or all of them can be reversed with similar result).

During operation of the device in the no-fault condition in FIG. 1, the indicator is depressed manually by appropriate force on the indicator element 12 until it has achieved the position shown. The indicator magnet 13 is magnetically held onto the surface of the iron core element 14. The assembly of the indicator magnet 13 will remain in this position in the absence of a potential applied to the coil and within reasonable limits of shock and vibration.

The south pole face of indicator magnet 13 is seen to approximately bisect the central axis of the two latch magnets 11. As a consequence, the latch magnets 11 have their closest face arranged as a south pole which results in both latching magnets being magnetically repelled to the extremes of the slots 16 in the housng 10. It should be noted that this repulsion force, although low, also aids in the latching of the indicator assembly onto the core 14. The outer face of the indicator means 12 is essentially flush with the overall indicator face of the housing 10. In a preferred construction, the end face of 12 and the end face of 10 are of the same color. The side portions of indicator element 12 are preferably of a different color so that when the element protrudes from the housing in the fault condition it may be easily visible.

Figure 2:
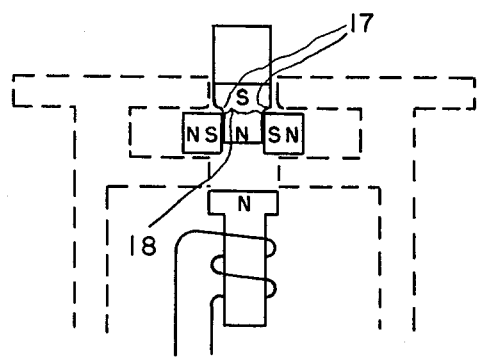
FIG. 2 illustrates the fault detection device of the present invention in the indicator position of the present invention

Referring now to FIG. 2, that figure illustrates the fault detection indicator of the present invention in its fault condition. The change of state occurs when a pulse of sufficient voltage magnitude is directed to the winding of the core and coil 15. If the voltage is of the appropriate direction to make the upper surface of the core 14 a north pole, then a corresponding magnetomotive force will cause an axial repulsion of the integral assembly 12 and 13 containing the indicator portion. That is, the north pole of the core and coil assembly will oppose the permanent magnetic north pole of element 13 and apply the described repulsion force. The assembly 12, 13 will move to the limits of travel imposed by the housing 10 (such limitation is not actually shown in the figure but is shown in FIG. 4). For the first half of the travel of the assemby 12, 13, the latching magnets 11 will remain in the repulsed condition of FIG. 1. Commencing with the second half of travel of the 12, 13 assembly, the aforementioned repulsion force changes to one of atraction. In this situation, the magnetic attraction force will increase until it is sufficient to move both permanent magnets 11 radially toward the indicator magnet 13. They will eventually abut the indicator magnet 13 and will nest within a recessed portion of that indicator magnet.

As shown in FIG. 2, the indicator magnet has its lower half of narrower diameter so as to enable the latching magnets 11 to nest within the recesses shown. The tops of the recesses form ledges 17. It is these ledges which prevent the indicator assembly from lowering itself after the applied potential is removed.

As indicated in FIG. 2, the device still remains in this latched condition by virtue of the magnetic attraction between the latch magnet south poles and the lower half of the indicator magnet north pole. In one embodiment of the present invention, a repulsion pulse length in the order of ten milliseconds or less was sufficient to cause the indicator to change from a fault state to a non-fault state.

In order to reset the unit, the indicator button is manually depressed. In order to give the button a "manual feel," the rounded ledges 17 are included in the indicator element which tends to restrict the initial motion of the indicator portion. It is preferred that the ledges have a radius 18 close to the smaller dimension of the indicator magnet The radii are included to provide an arrangement which is necessary to permit the latching magnets to slide free of the indicator magnet with increasing manual pressure of the indicator button. The manual force is required until the button moves one half of its travel, whereupon the magnetic attraction will override and the 12, 13 assembly will again latch into the no-fault mode shown in FIG. 1.

It is assumed that the electrical coil potential is terminated at this point. Should the potential remain, removal of the manual force will cause the 12, 13 assembly to pop out again in the fault mode; thus, the unit cannot be inadvertently reset to provide a false indication if, in fact, the cause of the fault is still outstanding.

Figure 3A:
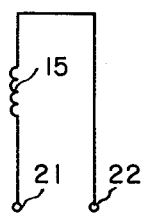
FIGS. 3a, 3b, 3c, and 3d illustrate in schematic form four possibilities for incorporating switches together with the fault indicating means of the present invention.
Figure 3B:
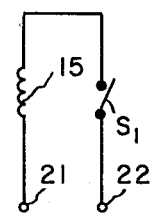
Figure 3C:
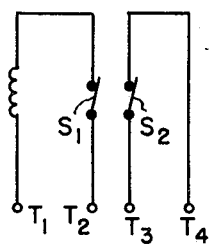
Figure 3D:
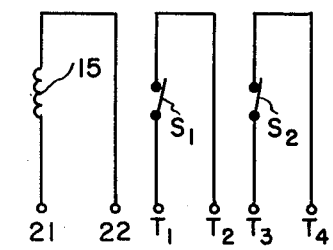

As will be described in more detail below, various switches may be incorporated to function in conjunction with the latch magnet. A variety of possible electrical configurations may result, some of which are indicated in the FIGS. 3a, 3b, 3c and 3d. In FIG. 3a, the electrical representation of the coil 15 is shown with the appropriate input terminals 21 and 22. In this configuration no switch is incorporated in the fault detection device. FIG. 3b illustrates a possible incorporation of a switch which is actuatable by the latch magnets. In this figure, the switch element is shown in series electrical connection with the coil 15. In addition, the switch element would be in the normally closed condition when the indicator is in the no-fault mode. Other arrangements of switches including a pair of switches which are connected to the latch magnets are shown in FIGS. 3c and 3d. Various logical arrangement of switches may be provided in conjunction with the fault indication device.

Figure 4B:
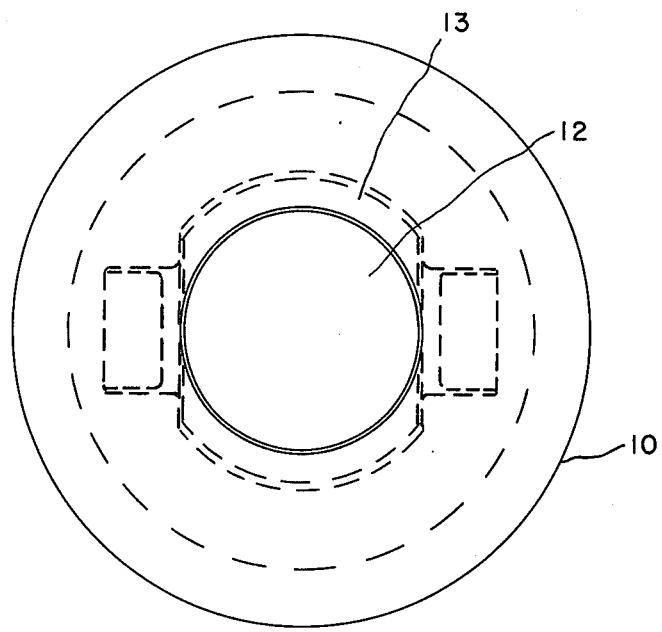
FIGS. 4a and 4b are top and frontal sectional views of one embodiment of the present invention.
Figure 4A:
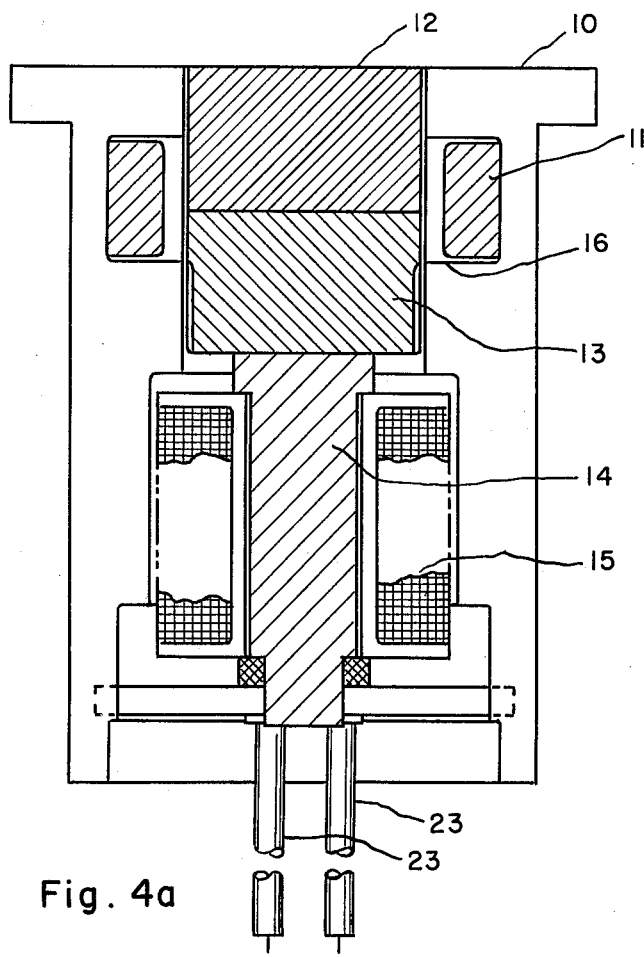

A more detailed construction of the fault detection device is shown in cross-sectional side view in FIG. 4a and corresponding top view 4b. In these figures, like numbers corresponding to like figures of the earlier description. In FIG. 4b, it may be seen that the indicator portion 12 is of the dimension of a circular configuration and it is of slightly smaller diameter than an opening provided in the top portion of the housing 10. The indicator magnet 13, however, is seen to be an irregular shape which is larger than the circular opening in the housing top. While the indicator magnet 13 is free to move within a recess which conforms to the irregular dimension of the indicator magnet within an intermediate portion of the housing at the top of the housing, the irregular portion will be stopped by the top layer of the housing which acts as a limit to axial travel of the indicator assembly 12 and 13.

In FIG. 4a, it will be seen that a housing 10 contains an axial recess in which an indicator 12 and indicator magnet 13 are disposed. The lower surface of indicator magnet 13 is flush with a core of the core and coil assembly 14 and 15. Side recesses 16 contain latch magnets 11. The terminal wires of the coil are brought out and are shown as 23 in FIG. 4a.

Figure 5:
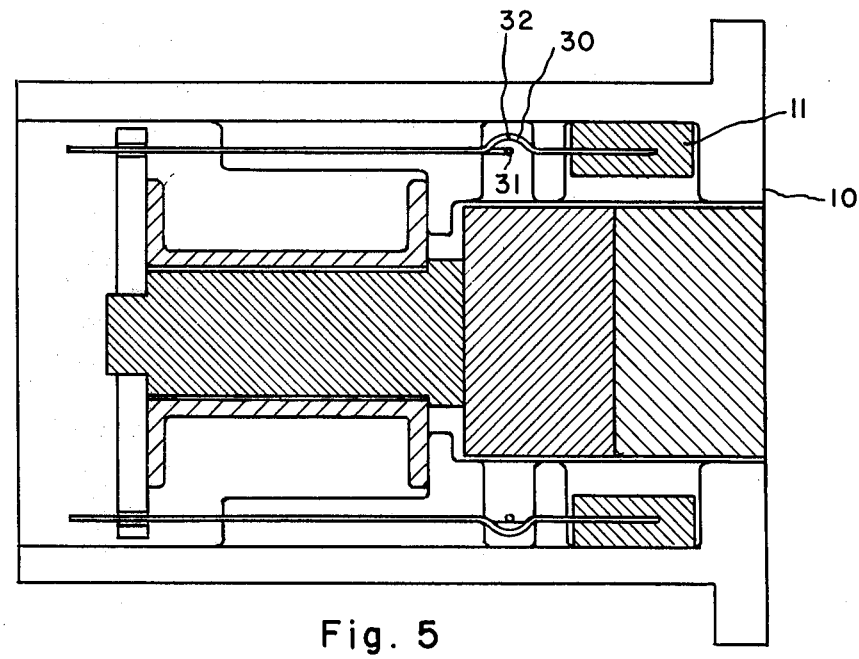
FIG. 5 is a frontal cross-section of the switch in accordance with the present invention illustrating one form of switch device which may be incorporated therein.
Figure 6:
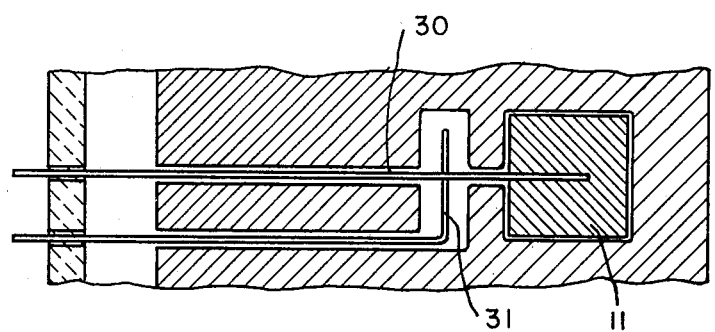
FIG. 6 is a cross-sectional top view of the device shown in FIG. 5.

Referring now to FIGS. 5 and 6, a description of one embodiment of the switches which may be employed with the fault detection apparatus of the present invention is shown. Here, the moving contact of the switch or switch arm is embedded at one end in one of the latch magnets 11. The switch element 30 has a semicircular bend in its central portion which forms a portion of the switch contact. The other end of switch element 30 is brought through the end of the housing as a terminal and is anchored there. A second element of the switch or stationary contact has a right angle portion which extends through the semi-circular portion of the first element of the switch. This right angle portion 31 (shown clearly in FIG. 6) is the stationary member of the switch and the other end of the stationary member is also brought through the housing end as a terminal.

The switch element is shown in its no-fault condition in FIGS. 5 and 6. Here a latch magnet 11 is at the extreme portion of the slot and the switch correspondingly is shown in an open condition. When a fault occurs, the magnet 11 will be inwardly directed toward the indicator element and will cause the longitudinal switch element 30 to pivot about the end portion which is affixed to the housing. More than one switch may be similarly incorporated in a similar manner.

While the invention has been described and illustrated with respect to preferred embodiments which provide satisfactory results, it should be understood by those skilled in the art that various changes and modifications may be made therein without departing from the true spirit and scope of the present invention.

What is claimed is:

1. A fault indication device adapted to being excited by an electrical voltage for indicating a fault condition comprising;

a housing;

an indicating element including an indicating element permanent magnet having first and second end portions of opposite magnetic polarity, said indicating element being free to move in a first predetermined direction within said housing;

a ferromagnetic core and coil assembly, the coil being a conductive wire wound about said, said coil having input terminals for application of an electrical voltage, said permanent magnet indicating element having its first end portion being disposed on the end surface of said core when said coil is not excited by an electrical voltage;

and at least one latching permanent magnet having first and second end portions of opposite magnetic polarity and being free to move within said housing in a direction at right angles to said first predetermined direction, said latching permanent magnet being oriented so that during said unexcited condition of said coil said latching permanent magnet is repelled by the second end portion of the indicating element permanent magent, said input terminals being adapted to receiving an excitation voltage which causes a magnetic polarity to appear on said core and which is repelling to said first end portion of said indicating element permanent magnet thereby forcing said indicating element to move in said first predetermined direction, whereby said second end portion of said indicating element permanent magnet is juxtaposed proximate to said latching permanent magnet thereby attracting said latching permanent magnet to said indicating element permanent magnet.

2. The fault indication device of claim 1, including a slot in said housing for guiding and limiting travel of said latching magnet.

3. The fault indication device of claim 2 including a pair of latching magnets on opposite sides of said indicating element, each magnet being disposed in a corresponding slot for guiding and limiting travel.

4. The fault indication device of claim 1 wherein said indicating element permanent magnet includes a recess for receiving said latching permanent magnet when said coil is excited, said indicating element being mechanically latched by the nesting of said latching permanent magnet in said recess.

5. The fault indication device of claim 4 including a pair of latching magnets and wherein said indicating element permanent magnet includes a pair or recesses for receiving said latching megnets when said coil is excited, said indicating element being mechanically latched by the nesting of said latching magnets in said recesses.

6. The fault indication device of claim 5 wherein said recesses include appropriate radii to allow said latching magnets to easily escape from said recesses when said indicating element is manually depressed.

7. The fault detection device of claim 1 wherein indicating element includes a portion affixed to said indicating element permanent magnet having an axial face of a first predetermined color and side portions of a second and different predetermined color.

8. The fault detection device of claim 7 wherein said housing has an end portion surrounding said end face of said indicating element portions, end portions of both being of the same color.

9. The fault detection device of claim 1 wherein each indicating element includes means to limit the travel of said indicating element when repelled by said core and coil.

10. The fault detection device of claim 9 wherein said housing includes an opening which is larger than the upper portion of the indicating element thus allowing said portion to pass through during coil excitation but which is smaller than the lower portion of the indicating element which serves to limit the travel of said indicating element.

11. The fault detection device of claim 1 wherein said indicating element includes at least one electrical switch responsive to movement of said latch magnet.

12. The fault detection device of claim 1 wherein said switch includes an arm, said arm of the switch being fixed at one end to said latching permanent magnet, the other end of said switch arm being fixed to a wall of said housing, said switch also having a fixed contact affixed to said housing.

* * * * *

UNITED STATES PATENT AND TRADEMARK OFFICE
CERTIFICATE OF CORRECTION

PATENT NO. : 3,995,243
DATED : November 13, 1976
INVENTOR(S) : FLOYD LEONARD MALMBORG It is certified that error appears in the above–identified patent and that said Letters Patent are hereby corrected as shown below:

Column 3, line 51, after 'condition' and before 'by virtue' it should read --by virtue of the mechanical retention of ledges 17 and also by--.

Column 1, line 23, "or" should be --for--.

Signed and Sealed this

Third Day of May 1977

[SEAL]

Attest:

RUTH C. MASON
Attesting Officer

C. MARSHALL DANN
Commissioner of Patents and Trademarks